(12) United States Patent
Cho et al.

(10) Patent No.: US 10,403,572 B2
(45) Date of Patent: Sep. 3, 2019

(54) SEMICONDUCTOR DEVICE AND SEMICONDUCTOR PACKAGE INCLUDING THE SAME

(71) Applicant: SAMSUNG ELECTRONICS CO., LTD., Suwon-si, Gyeonggi-do (KR)

(72) Inventors: Young-Chul Cho, Seongnam-si (KR); Min-Su Ahn, Suwon-si (KR); Jung-Hwan Choi, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 97 days.

(21) Appl. No.: 15/679,662

(22) Filed: Aug. 17, 2017

(65) Prior Publication Data

US 2018/0122741 A1    May 3, 2018

(30) Foreign Application Priority Data

Nov. 2, 2016  (KR) .......................... 10-2016-0144958
Dec. 29, 2016  (KR) .......................... 10-2016-0181797

(51) Int. Cl.
| | |
|---|---|
| *H01L 23/48* | (2006.01) |
| *H01L 23/52* | (2006.01) |
| *H01L 29/40* | (2006.01) |
| *H01L 23/522* | (2006.01) |
| *H01L 23/532* | (2006.01) |
| *H01L 23/00* | (2006.01) |
| *H01L 23/525* | (2006.01) |

(52) U.S. Cl.
CPC ........ *H01L 23/5226* (2013.01); *H01L 23/525* (2013.01); *H01L 23/5227* (2013.01); *H01L 23/53295* (2013.01); *H01L 24/05* (2013.01); *H01L 24/08* (2013.01); *H01L 2224/02331* (2013.01); *H01L 2224/05024* (2013.01); *H01L 2224/05554* (2013.01); *H01L 2224/48463* (2013.01); *H01L 2224/49171* (2013.01); *H01L 2924/00014* (2013.01)

(58) Field of Classification Search
CPC ....... H01L 2224/05093; H01L 2224/48; H01L 2224/227; H01L 2224/85; H01L 2224/48463; H01L 2224/97
USPC .................................................. 257/784, 758
See application file for complete search history.

(56) References Cited

U.S. PATENT DOCUMENTS

| | | | |
|---|---|---|---|
| 6,511,878 B1 | 1/2003 | Matsumura | |
| 6,730,973 B2 * | 5/2004 | Hibi ..................... | H01L 27/105 257/314 |
| 7,663,206 B2 | 2/2010 | Lee | |

(Continued)

*Primary Examiner* — S. V. Clark
(74) *Attorney, Agent, or Firm* — Lee & Morse, P.C.

(57) ABSTRACT

A semiconductor device includes a substrate having a cell region and a circuit region, an upper wiring layer on the substrate, and a redistribution wiring layer on the upper wiring layer. The upper wiring layer includes a secondary uppermost wiring in the circuit region and an uppermost wiring on the secondary uppermost wiring. The uppermost wiring includes an uppermost chip pad electrically connected to the secondary uppermost wiring. At least a portion of the uppermost chip pad in the cell region. The redistribution wiring layer includes a redistribution wiring electrically connected to the uppermost chip pad. At least a portion of the redistribution wiring serving as a landing pad connected to an external connector.

19 Claims, 16 Drawing Sheets

(56) References Cited

U.S. PATENT DOCUMENTS

| | | | |
|---|---|---|---|
| 8,022,550 B2* | 9/2011 | Koubuchi | G03F 9/7076 |
| | | | 257/752 |
| 8,064,222 B2 | 11/2011 | Nishio et al. | |
| 8,084,279 B2* | 12/2011 | Kasaoka | G03F 1/32 |
| | | | 257/E21.523 |
| 8,115,291 B2* | 2/2012 | Baek | H01L 23/49816 |
| | | | 257/686 |
| 8,611,125 B2 | 12/2013 | Hong | |
| 8,779,576 B2* | 7/2014 | Park | H01L 24/02 |
| | | | 257/692 |
| 9,418,951 B2 | 8/2016 | Wu et al. | |
| 2013/0087888 A1* | 4/2013 | Kikuchi | H01L 21/76814 |
| | | | 257/532 |
| 2013/0257564 A1 | 10/2013 | Huang et al. | |
| 2015/0245525 A1 | 8/2015 | Ping | |
| 2015/0333021 A1 | 11/2015 | Wu et al. | |
| 2016/0190101 A1 | 6/2016 | Yu et al. | |

* cited by examiner

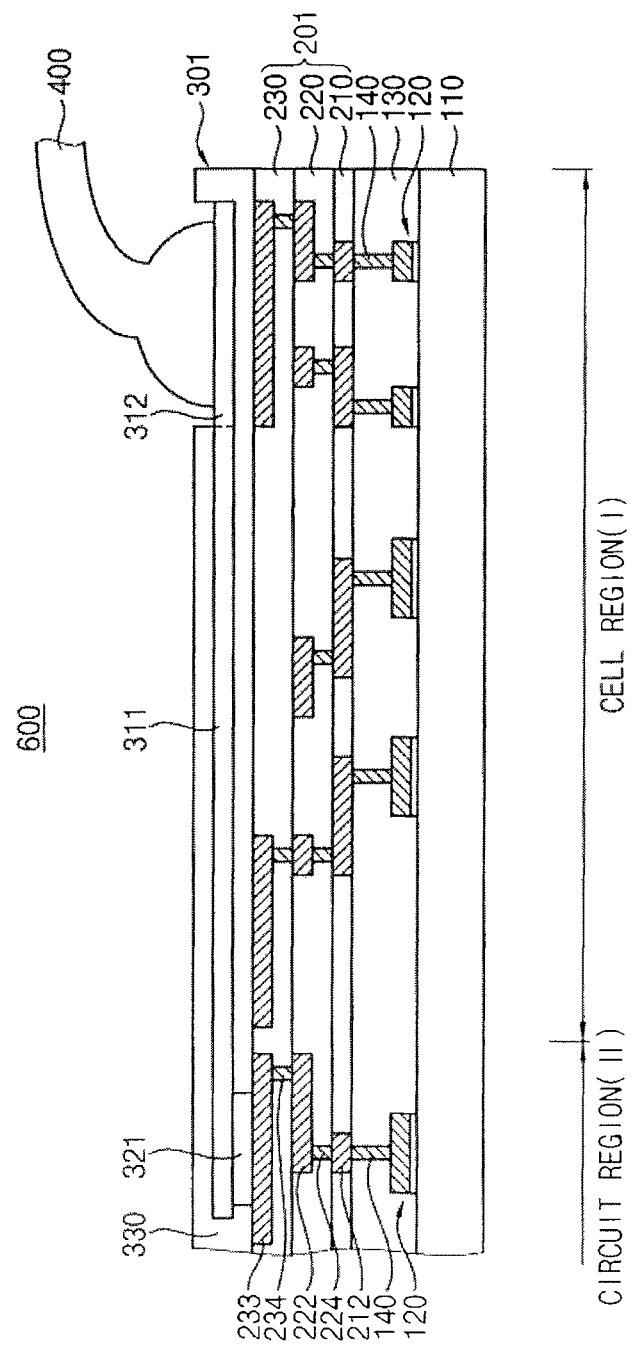

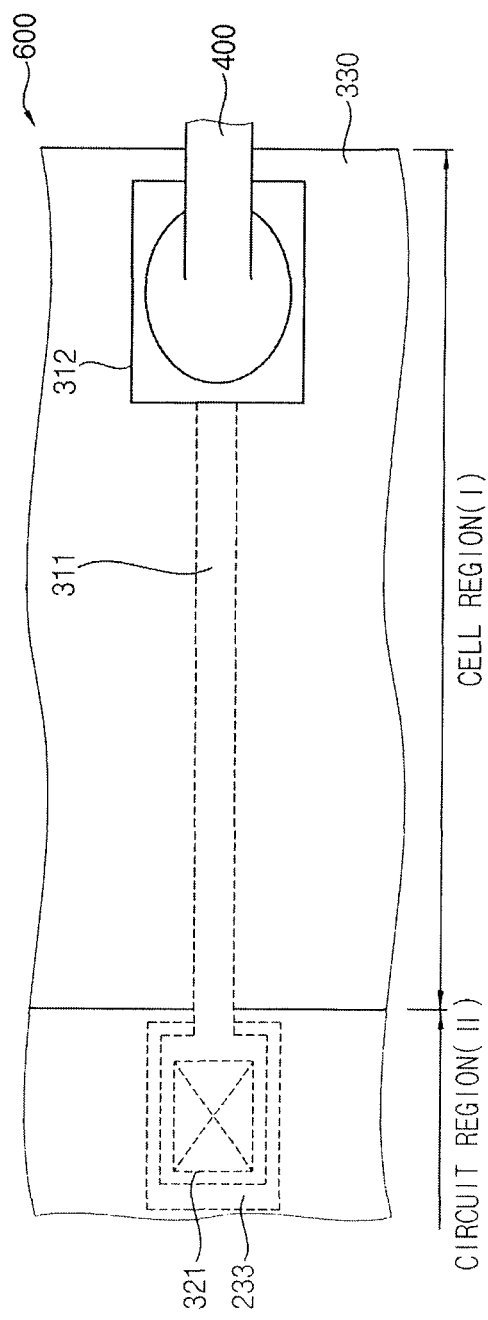

SEMICONDUCTOR DEVICE AND SEMICONDUCTOR PACKAGE INCLUDING THE SAME

CROSS-REFERENCE TO RELATED APPLICATION

Korean Patent Application Nos. 10-2016-0144958, filed on Nov. 2, 2016, and 10-2016-0181797, filed on Dec. 29, 2016, and entitled, "Semiconductor Device and Semiconductor Package Including the Same," is incorporated by reference herein in its entirety.

BACKGROUND

1. Field

One or more embodiments described herein relate to a semiconductor device and a semiconductor package including a semiconductor device.

2. Description of the Related Art

A semiconductor device may include a semiconductor chip mounted on a semiconductor package. The package may include chip pads for establishing electrical connection with an external device, and redistribution wiring electrically connected to the chip pads. Some of the redistribution wiring may be used as redistribution landing pads connected to bonding wires.

The chip pads are arranged in a middle region of the semiconductor device. This increases the total size of the chip at least by the size of the chip pads, and also limits the design freedom of wirings for establishing electrical connection with the redistribution landing pad in a peripheral region of the semiconductor device.

SUMMARY

In accordance with one or more embodiments, a semiconductor device includes a substrate including a cell region and a circuit region; an upper wiring layer on the substrate and including a secondary uppermost wiring in the circuit region and an uppermost wiring on the secondary uppermost wiring, the uppermost wiring including an uppermost chip pad electrically connected to the secondary uppermost wiring, at least a portion of the uppermost chip pad in the cell region; and a redistribution wiring layer on the upper wiring layer and including a redistribution wiring electrically connected to the uppermost chip pad, at least a portion of the redistribution wiring serving as a landing pad connected to an external connector.

In accordance with one or more other embodiments, a semiconductor device includes a substrate including a cell region, a circuit region, and circuit patterns; an insulation interlayer on the substrate to cover the circuit patterns; an upper wiring layer on the insulation interlayer and including first to fourth wirings sequentially stacked on one another, the secondary uppermost third wiring including a secondary uppermost wiring in the circuit region, the uppermost fourth wiring including an uppermost chip pad electrically connected to the secondary uppermost wiring, at least a portion of the uppermost chip pad in the cell region; and a redistribution wiring layer on the upper wiring layer and including a redistribution wiring electrically connected to the uppermost chip pad, at least a portion of the redistribution wiring serving as a landing pad connected to an external connector.

In accordance with one or more other embodiments, a semiconductor device includes a cell region; a circuit region; a chip pad at least partially in the cell region; a first wiring layer in the circuit region and electrically connected to the chip pad; and a second wiring layer on the first wiring layer and including at least one redistribution wiring electrically connected to the chip pad.

BRIEF DESCRIPTION OF THE DRAWINGS

Features will become apparent to those of skill in the art by describing in detail exemplary embodiments with reference to the attached drawings in which:

FIG. 4 illustrates a comparative example of a semiconductor device;

FIGS. 5A and 5B illustrate, respectively, an embodiment of an uppermost chip pad of the semiconductor device in FIG. 3 and the uppermost chip pad of the semiconductor device in FIG. 4;

DETAILED DESCRIPTION OF EXAMPLE EMBODIMENTS

Figure 1:
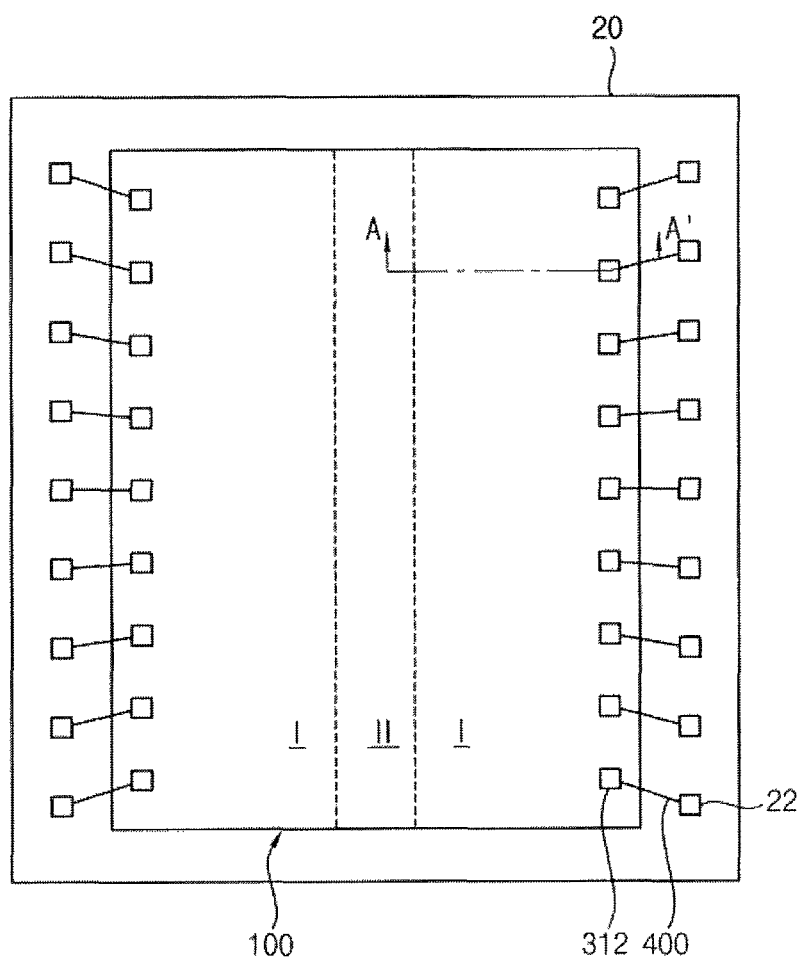
FIG. 1 illustrates an embodiment of a semiconductor package.
Figure 2:
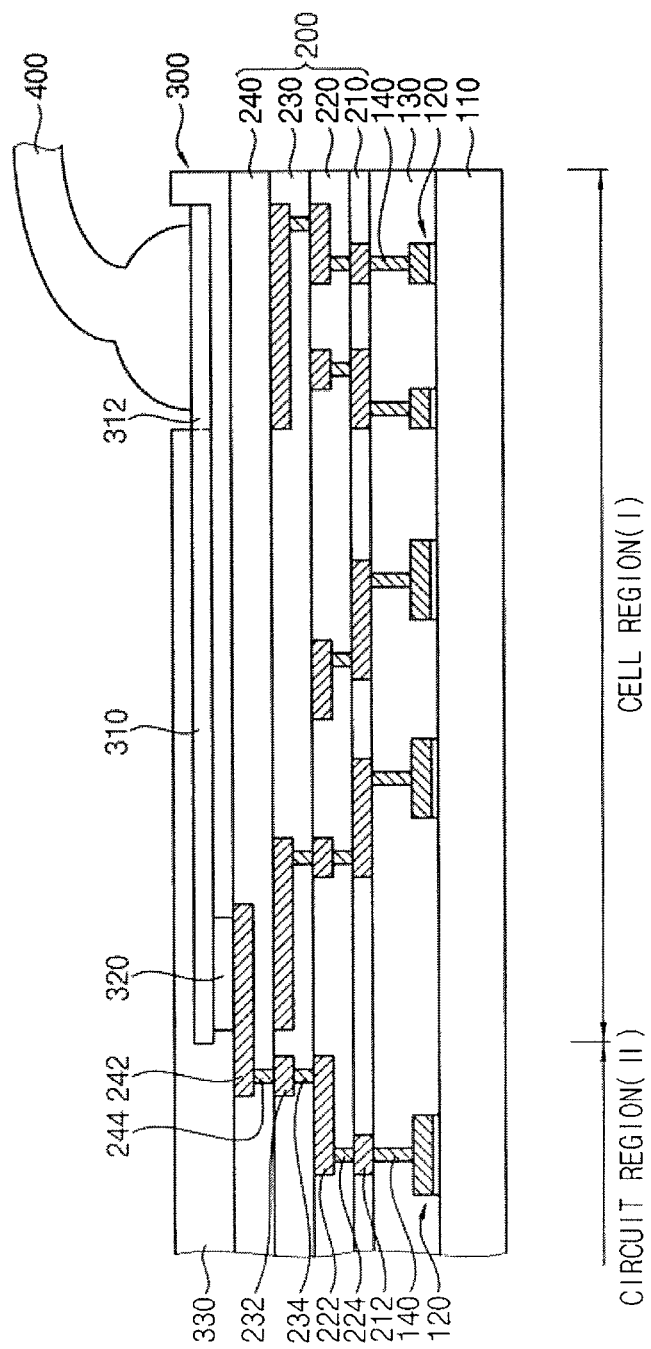
FIG. 2 illustrates an embodiment of a semiconductor device.
Figure 3:
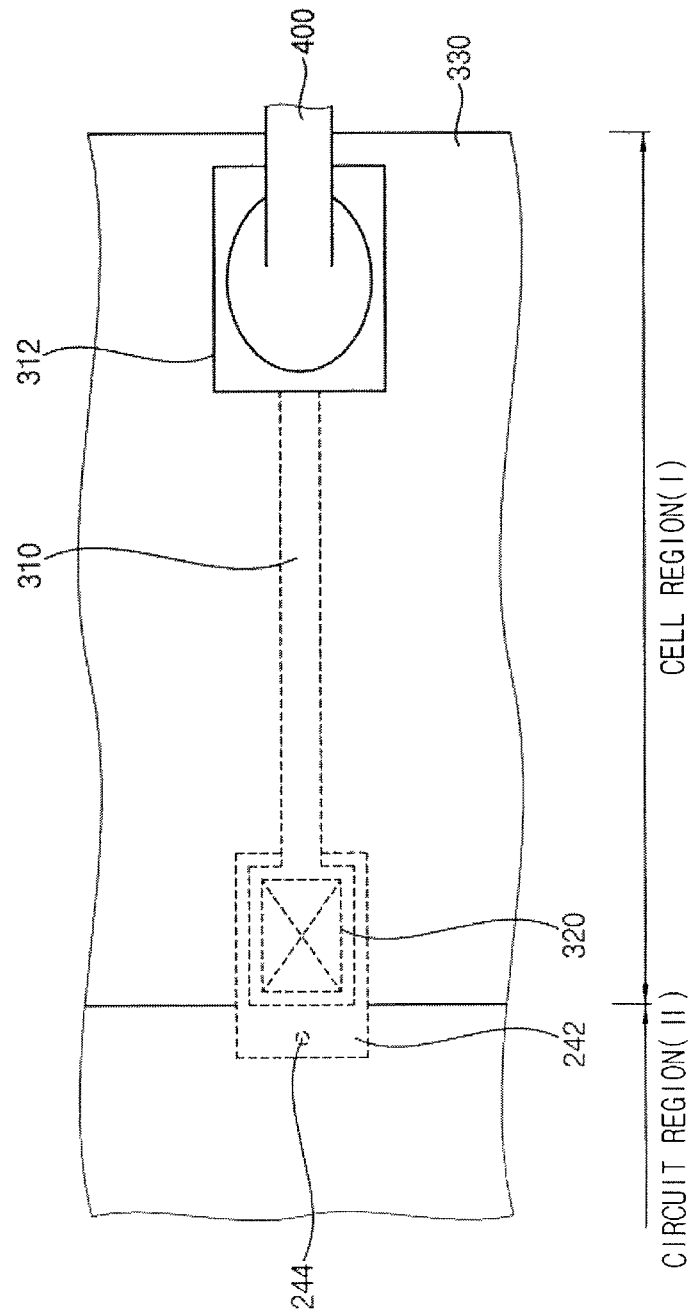
FIG. 3 illustrates an embodiment of a plan view of the semiconductor device.

FIG. 1 illustrates an embodiment of a semiconductor package 10. FIG. 2 illustrates a cross-sectional view an embodiment of a semiconductor device, which, for example, may be included in the semiconductor package 10 in FIG. 1. FIG. 3 is an embodiment of a plan view illustrating the semiconductor device in FIG. 2. FIG. 2 illustrates a cross-sectional view taken along line A-A' in FIG. 1.

Referring to FIGS. 1 to 3, a semiconductor package 10 may include a semiconductor chip device (or chip) mounted on a package substrate 20. The semiconductor package 10 may further include a plurality of conductive connection members (connectors) 400 and a sealing member. The conductive connection members 400 electrically connect the semiconductor device 100 to the package substrate 20. The sealing member covers the semiconductor device 100.

In example embodiments, the package substrate 20 has an upper surface opposing a lower surface. The package substrate 20 may include, for example, a printed circuit board (PCB). e.g., a multi-layer circuit board with vias and circuit elements therein. The semiconductor device 100 may be mounted on the upper surface of the package substrate 20. The semiconductor device 100 may be adhered to the upper surface of the package substrate using, for example, an adhesive film. One or more semiconductor devices may be stacked on the upper surface of the package substrate 20.

The semiconductor device 100 may include at least one integrated circuit. In one embodiment, the semiconductor device 100 includes a semiconductor chip having a memory circuit, e.g., a volatile memory device such as DRAM or a non-volatile memory device such as VNAND.

The semiconductor device 100 may include bonding pads (e.g., redistribution landing pads 312) on an upper surface, which may be an active surface. The landing pads 312 may include input/output terminals which serve, for example, as data pins, power pins, and ground pins.

The semiconductor device 100 may be electrically connected to the package substrate 20 by the conductive connection members 400. The conductive connection members 400 may electrically connect the redistribution landing pads 312 of the semiconductor device 100 to a substrate pad 22 of the package substrate 20. Each conductive connection member 400 may include a bonding wire. The semiconductor device 100 may be stacked on the package substrate 20 by the adhesive film and may be electrically connected to the package substrate 20 by the conductive connection members 400. In one embodiment, each conductive connection member 400 may include a solder bump, a penetrating electrode, a solder ball, a conductive paste, etc.

In example embodiments, the semiconductor device 100 may include a substrate 110, and an insulation interlayer 130, an upper wiring layer 200 and a redistribution layer 300 sequentially formed on the substrate 110.

The substrate 110 may include a semiconductor material, e.g., silicon, germanium, silicon-germanium, etc., or Group III-V semiconductor compounds, e.g., GaP, GaAs, GaSb, etc. In an example embodiment, the substrate 110 may be a silicon substrate, a germanium substrate, a silicon-germanium substrate, a silicon-on-insulator (SOI) substrate, a germanium-on-insulator (GOI) substrate, etc.

In example embodiments, the substrate 110 may include a first region I and a second region II, which may be a cell region and a circuit region, respectively. Memory cells may be formed in the first region I and peripheral circuits for driving the memory cells may be formed in the second region II. For example, the circuit region II may be a region extending in a direction along a middle region of the semiconductor device 100. The cell region II may be a region extending from the circuit region II to an edge region of the semiconductor device 100.

Circuit patterns 120 may be formed on the substrate 110 in the first and second regions I and II. The circuit patterns 120 may include various elements, e.g., transistor, diode, capacitor, etc. An isolation region, an active region, a source/drain region, etc., may be in the substrate 110. The circuit patterns may constitute the circuit device.

The insulation interlayer 130 may be on the substrate 110 to cover the circuit patterns 120. Contact plugs 140 may penetrate through the insulation interlayer 130 and contact respective ones of the circuit patterns 120. The insulation interlayer may be formed of an oxide, e.g., silicon oxide.

The upper wiring layer 200 may include first to fourth metal wiring layers 210, 220, 230 and 240 sequentially formed on the insulation interlayer 130. The upper wiring layer may be formed, for example, by a back-end-of-line (BEOL) process of a semiconductor manufacturing process.

The first metal wiring layer 210 may include a first wiring 212 that contacts an upper surface of the contact plug 140. The first wiring 212 may be electrically connected to the contact plug 140 by a first via. The second metal wiring layer 220 may include a second wiring 222 electrically connected to the first wiring 212 by a second via 224. The third metal wiring layer 230 may include a third wiring 232 electrically connected to the second wiring 222 by a third via 234. The fourth metal wiring layer 240 may include a fourth wiring 242 electrically connected to the third wiring 232 by a fourth via 244. The first to fourth wirings 212, 222, 232, and 242 and the first to fourth vias may be formed of a metal, e.g., tungsten, titanium, tantalum, copper, aluminum, etc., and/or a metal nitride, e.g., titanium nitride, tantalum nitride, tungsten nitride, etc.

In example embodiments, the fourth metal wiring layer 240 may be an uppermost wiring layer, and the third metal wiring layer 230 may be a secondary uppermost wiring layer. The third wiring may include a secondary uppermost wiring 232 in the circuit region II. The fourth metal wiring layer 240 may include an uppermost wiring, and at least a portion of the uppermost wiring may include an uppermost chip pad 242 arranged in the cell region.

The uppermost chip pad 242 may be formed in the uppermost metal wiring layer of the semiconductor device 100, and may be a chip pad for electrical connection with an external device. For example, the uppermost chip pad 242 may extend from the circuit region II to the cell region I. A first portion of the uppermost chip pad 242 may be in the cell region I and a second portion of the uppermost chip pad 242 may be in the circuit region II. The uppermost chip pad 242 may be a portion of the uppermost wiring in the cell region I or a portion of the uppermost wiring in the cell region I and the circuit region II. The second portion of the uppermost chip pad 242 may overlap the secondary uppermost wiring 232.

The redistribution wiring layer 300 may include a redistribution wiring 310 and a protection layer 330. The redistribution wiring 310 is on the upper wiring layer 200. The protection layer 330 is on the upper wiring layer 200, covers the redistribution wiring 310, and exposes at least a portion of a first end portion of the redistribution wiring 310, that is, a redistribution landing pad 312. The redistribution wiring layer 300 may include a redistribution via 320 in the cell region I and on the uppermost wiring, that is, the uppermost chip pad 242. A second end portion of the redistribution wiring 310 opposite to the first end portion may be on the redistribution via 320.

The redistribution wiring 310 may extend in at least one direction. For example, a first portion of the redistribution wiring 310 may extend in a first direction and a second portion of the redistribution wiring 310 may extend a second direction different from the first direction. The first end portion of the redistribution wiring 310 may be adjacent to the edge of the semiconductor device 100. The first end portion of the redistribution wiring 310 may include the redistribution landing pad 312. The second end portion of the redistribution wiring 310 may contact the underlying redistribution via 320. Accordingly, the second end portion of the redistribution wiring 310 may be electrically connected to the uppermost wiring, that is, the uppermost chip pad 242 by the redistribution via 320.

The uppermost chip pad 242 may have a size sufficient to support the redistribution wiring 310. In one embodiment, the uppermost chip pad 242 may be connected directly to an external connection member without a redistribution wiring. The uppermost chip pad 242 may have a planar size sufficient for connection with the external connection member.

In example embodiments, the redistribution wiring 310 may extend in one direction in the cell region I. The redistribution wiring 310 may extend in a direction from the middle portion toward the edge of the semiconductor device 100. The redistribution wiring 310 may be connected to the uppermost chip pad 242 as the portion of the uppermost wiring by the redistribution wiring 310.

FIG. 4 illustrates a comparative example of a semiconductor device 600, which is substantially the same as or similar to the semiconductor device in FIGS. 1 to 3 except for omission of a fourth metal wiring layer and thus a positional change of a chip pad.

Referring to FIG. 4, the semiconductor device 600 includes a substrate 110, and an insulation interlayer 130, an upper wiring layer 201 and a redistribution wiring layer 301 sequentially formed on the substrate 110. The upper wiring layer 201 may include first to third metal wiring layers 210, 220 and 230 sequentially formed on the insulation interlayer 130.

The first metal wiring layer 210 includes a first wiring 212 which contacts an upper surface of a contact plug 140. The first wiring 212 is electrically connected to the contact plug 140 by a first via. The second metal wiring layer 220 includes a second wiring 222 electrically connected to the first wiring 212 by a second via 224. The third metal wiring layer 230 includes a third wiring 232 electrically connected to the second wiring 222 by a third via 234.

The third metal wiring layer 230 is an uppermost wiring layer, and the second metal wiring layer 220 is a secondary uppermost wiring layer. The second wiring includes a secondary uppermost wiring 222 in a circuit region II. The third wiring includes an uppermost chip pad 233 in the circuit region II. The uppermost chip pad 233 is in the uppermost metal wiring layer of the semiconductor device 600, and is a chip pad for establishing electrical connection with an external device.

The redistribution wiring layer 301 includes a redistribution wiring 311 on the upper wiring layer 201 and a protection layer 330 on the upper wiring layer 201 to cover the redistribution wiring 311 and expose at least a portion of a first end portion of the redistribution wiring 311, that is, a redistribution landing pad 312. The redistribution wiring layer 301 includes a redistribution via 321 in the circuit region II and on the uppermost wiring, that is, the uppermost chip pad 233. A second end portion of the redistribution wiring 311 opposite to the first end portion is arranged on the redistribution via 321.

Figure 5A:
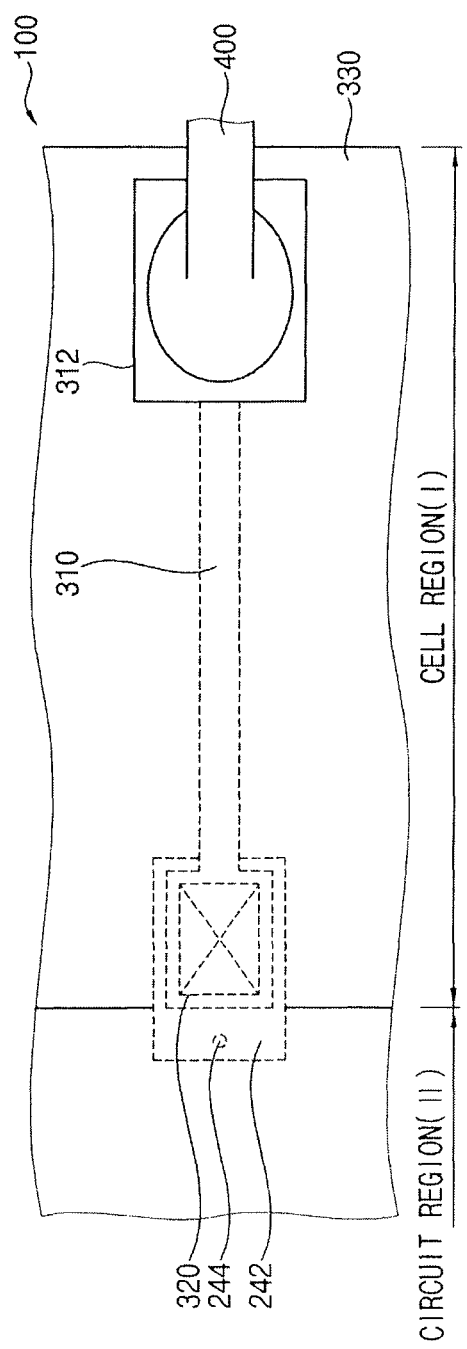

FIG. 5A illustrates the uppermost chip pad of the semiconductor device in FIG. 3, and FIG. 5B illustrates the uppermost chip pad of the semiconductor device in FIG. 4.

Referring to FIG. 5A, the uppermost chip pad 242 in FIG. 2 may extend from the circuit region II to the cell region I and the redistribution wiring 310 may be in the cell region I. On the other hand, in FIG. 5B, the uppermost chip pad 232 in FIG. 4 is in the circuit region II and the redistribution wiring 311 may extend from the circuit region II to a cell region I.

The uppermost chip pad 233 in FIG. 5A is in the circuit region II and has a sufficient size for supporting the redistribution wiring 311, and thus may occupy a relatively large space in the circuit region II.

The uppermost chip pad 242 in FIG. 5B may extend from the circuit region II to the cell region I, and the redistribution via 320 on the uppermost chip pad 242 may be arranged at a predetermined position in the cell region I, not the circuit region II. For example, the position of the uppermost chip pad occupying the circuit region II may be shifted to the cell region I by a predetermined distance S1. Thus, the area of the circuit region II may be reduced by at least the shifted area of the uppermost chip pad, to thereby reduce total chip size. Further, design freedom for wirings in the circuit region II may be increased.

Figure 6:
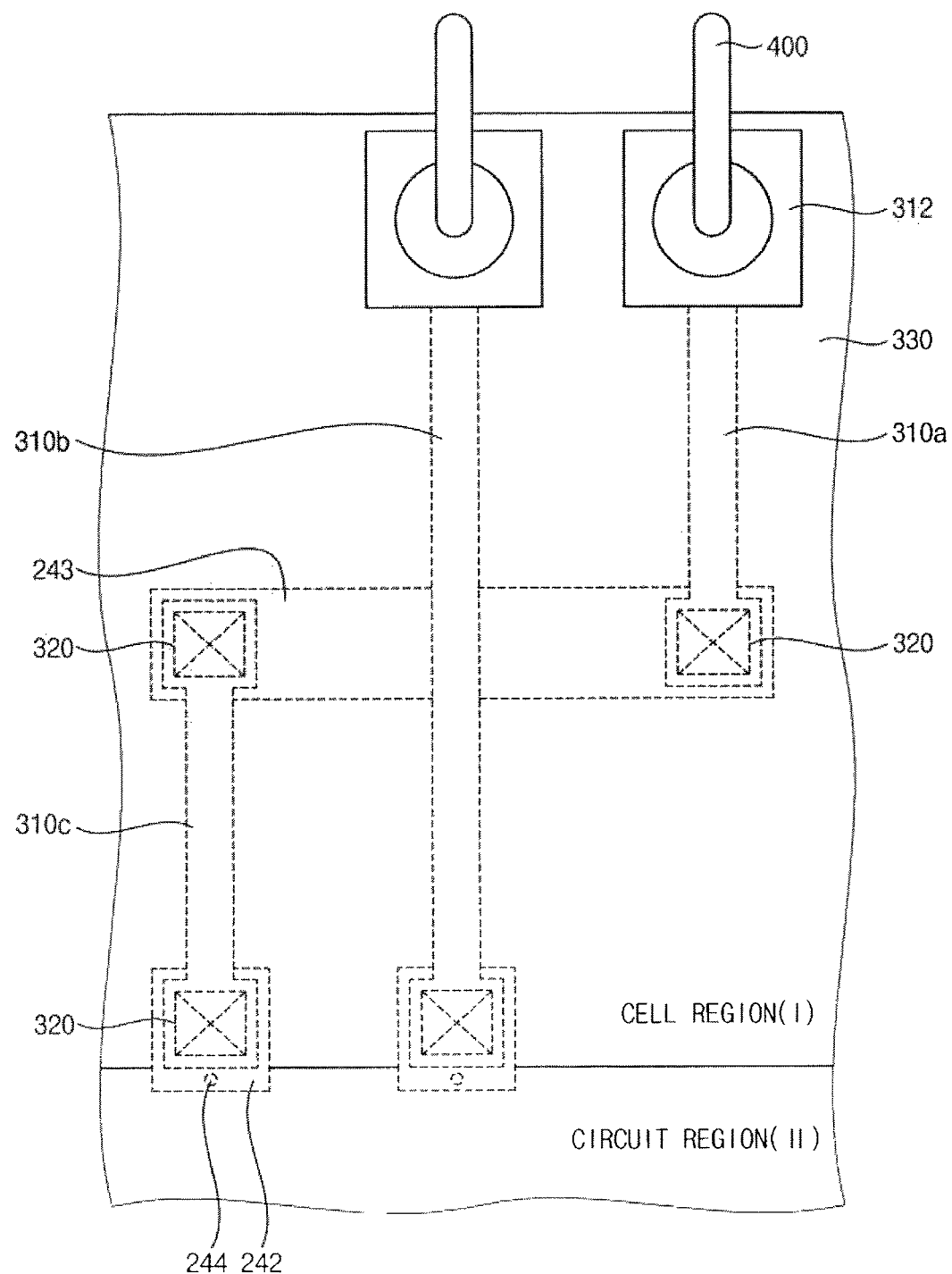
FIG. 6 illustrates another embodiment of a semiconductor device.

FIG. 6 is a plan view illustrating another embodiment of a semiconductor device, which may be substantially the same or similar to the semiconductor device of FIGS. 1 to 3, except for an uppermost connection wiring connecting redistribution wirings to each other.

Referring to FIG. 6, first to third redistribution wirings 310a, 310b, and 310c may be spaced apart from one another in a cell region I. The first to third redistribution wirings 310a, 310b, and 310c may be on an uppermost wiring layer and may extend in a first direction.

In example embodiments, an uppermost wiring of the uppermost wiring layer may include an uppermost connection wiring 243 which electrically connects the first and third redistribution wirings 310a and 310c to each other. The second redistribution wiring 310b may be between the first and third redistribution wirings 310a and 310c. The first and third redistribution wirings 310a and 310c may be connected to each other by the uppermost connection wiring 243. The uppermost connection wiring 243 may be under the second redistribution wiring 310b and extend in a second direction crossing the first direction of the second redistribution wiring 310b.

A first end portion of the uppermost connection wiring 243 may be connected to an end portion of the first redistribution wiring 310a by a redistribution via 320 in the cell region I. A second end portion of the uppermost connection wiring 243 may be connected to an end portion of the third redistribution wiring 310c by a redistribution via 320 in the cell region I.

Accordingly, the same power/ground or data signal may be applied directly to a plurality of the redistribution wirings using the uppermost connection wiring, not a detour path.

Figure 7:
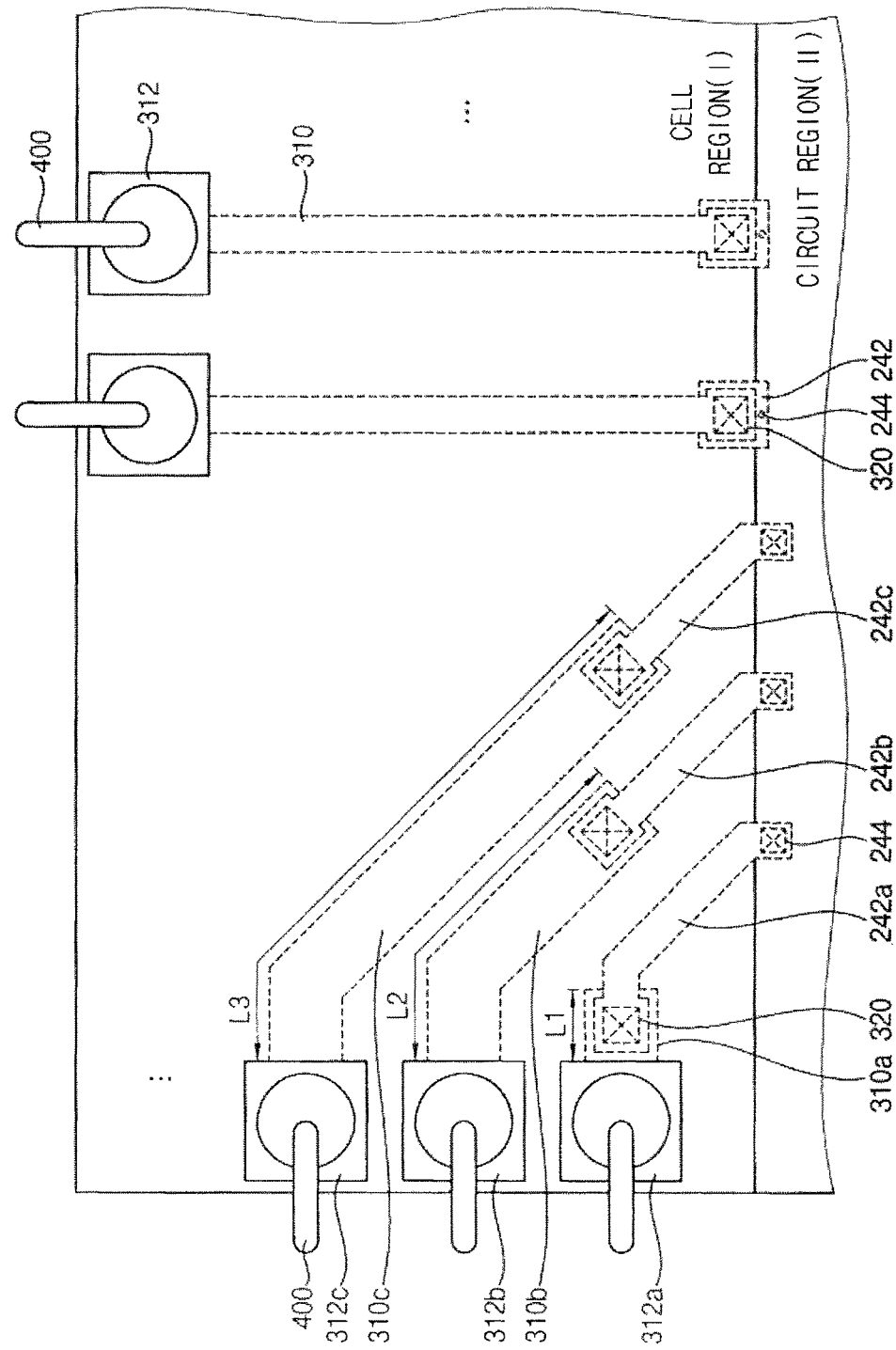
FIG. 7 illustrates another embodiment of a semiconductor device.

FIG. 7 illustrates another embodiment of a semiconductor device, which may be substantially the same or similar to the semiconductor device of FIGS. 1 to 3, except for redistribution wirings respectively connected to uppermost wirings of different lengths.

Referring to FIG. 7, first to third redistribution wirings 310a, 310b, and 310c may be spaced apart from one another and extend in a cell region I. First to third redistribution landing pads 312a, 312b, and 312c of the first to third redistribution wirings 310a, 310b, and 310c may be arranged along an edge of a semiconductor device and spaced apart from each other.

An end portion of a first uppermost wiring 242a (e.g., a first uppermost chip pad portion) may be connected to an end portion of the first redistribution wiring 310a by a redistribution via 320 in the cell region I. Another end portion of the first uppermost wiring 242a may be connected to an end portion of a secondary uppermost wiring by a fourth via 244 in a circuit region II.

An end portion of a second uppermost wiring 242b (e.g., a second uppermost chip pad portion) may be connected to an end portion of the second redistribution wiring 310b by a redistribution via 320 in the cell region I. Another end portion of the second uppermost wiring 242b may be connected to an end portion of a secondary uppermost wiring by a fourth via 244 in the circuit region II.

An end portion of a third uppermost wiring 242c (e.g., a third uppermost chip pad portion) may be connected to an end portion of the third redistribution wiring 310c by a redistribution via 320 in the cell region I. Another end portion of the third uppermost wiring 242c may be connected to an end portion of a secondary uppermost wiring by a fourth via 244 in the circuit region II.

In example embodiments, the first redistribution wiring 310a may have a first length L1, the second redistribution wiring 310b may have a second length L2 greater than the first length L1, and the third redistribution wiring 310c may have a third length L3 greater than the second length L2. The first uppermost wiring 242a may have a fourth length, the second uppermost wiring 242b may have a fifth length less than the fourth length, and the third uppermost wiring 242c may have a sixth length less than the fifth length. For example, the first redistribution wiring 310a and the first uppermost wiring 242a may have a first RC value, the second redistribution wiring 310b and the second uppermost wiring 242b may have a second RC value, and the third redistribution wiring 310c and the third uppermost wiring 242c may have a third RC value.

Accordingly, the length (width, thickness, etc.) ratio of the first to third redistribution wirings 310a, 310b, and 310c and the first to third uppermost wirings 242a, 242b, and 242c may be adjusted such that timing skews between the applied signals thereto may be reduced or removed.

Figure 8:
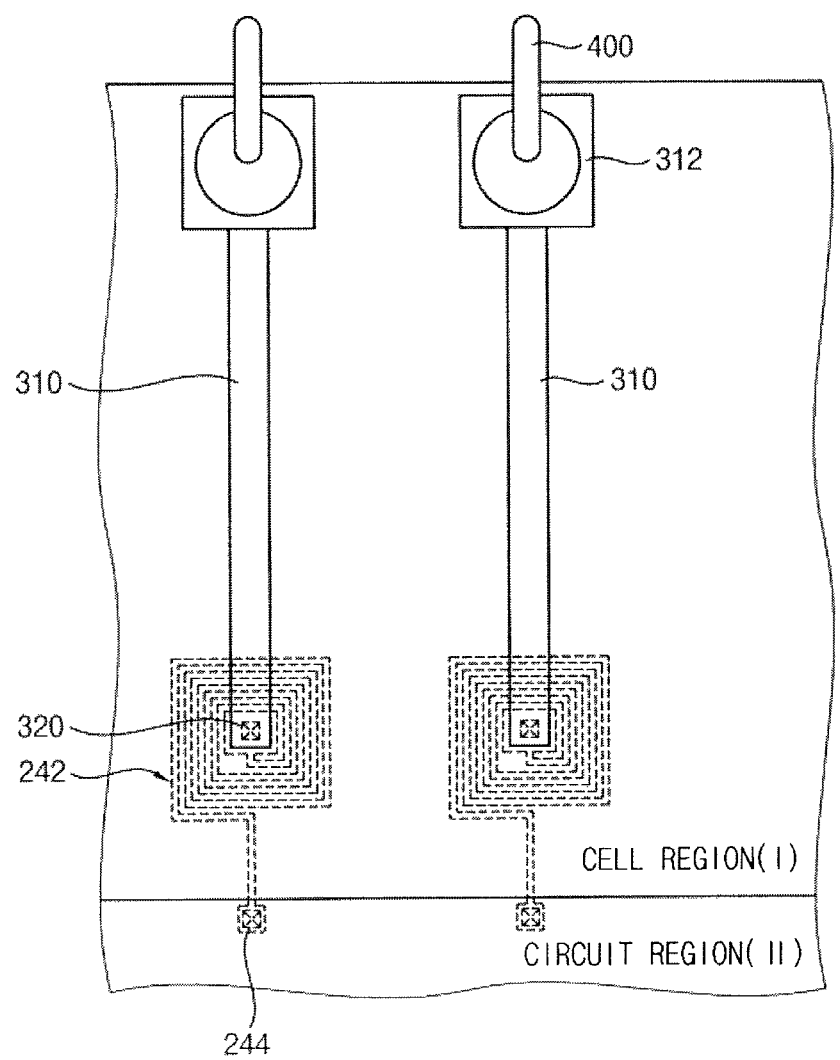
FIG. 8 illustrates another embodiment of a semiconductor device.

FIG. 8 illustrates another embodiment of a semiconductor device, which may be substantially the same as or similar to the semiconductor device of FIGS. 1 to 3, except for a structure of an uppermost wiring serving as an inductor.

Referring to FIG. 8, a first end portion of an uppermost wiring 242 (e.g., an uppermost chip pad portion) may be connected to an end portion of a redistribution wiring 310 by a redistribution via 320 in a cell region I. A second end portion of the uppermost wiring 242 may be connected to a secondary uppermost wiring by a fourth via 244 in a circuit region II. In example embodiments, at least a portion of the uppermost wiring 242 may include an inductor having, for example, a spiral shape in predetermined space in the cell region I. The inductor may provide an inductive peaking effect on a redistribution landing pad 312 for high speed or low power operation.

Figure 9:
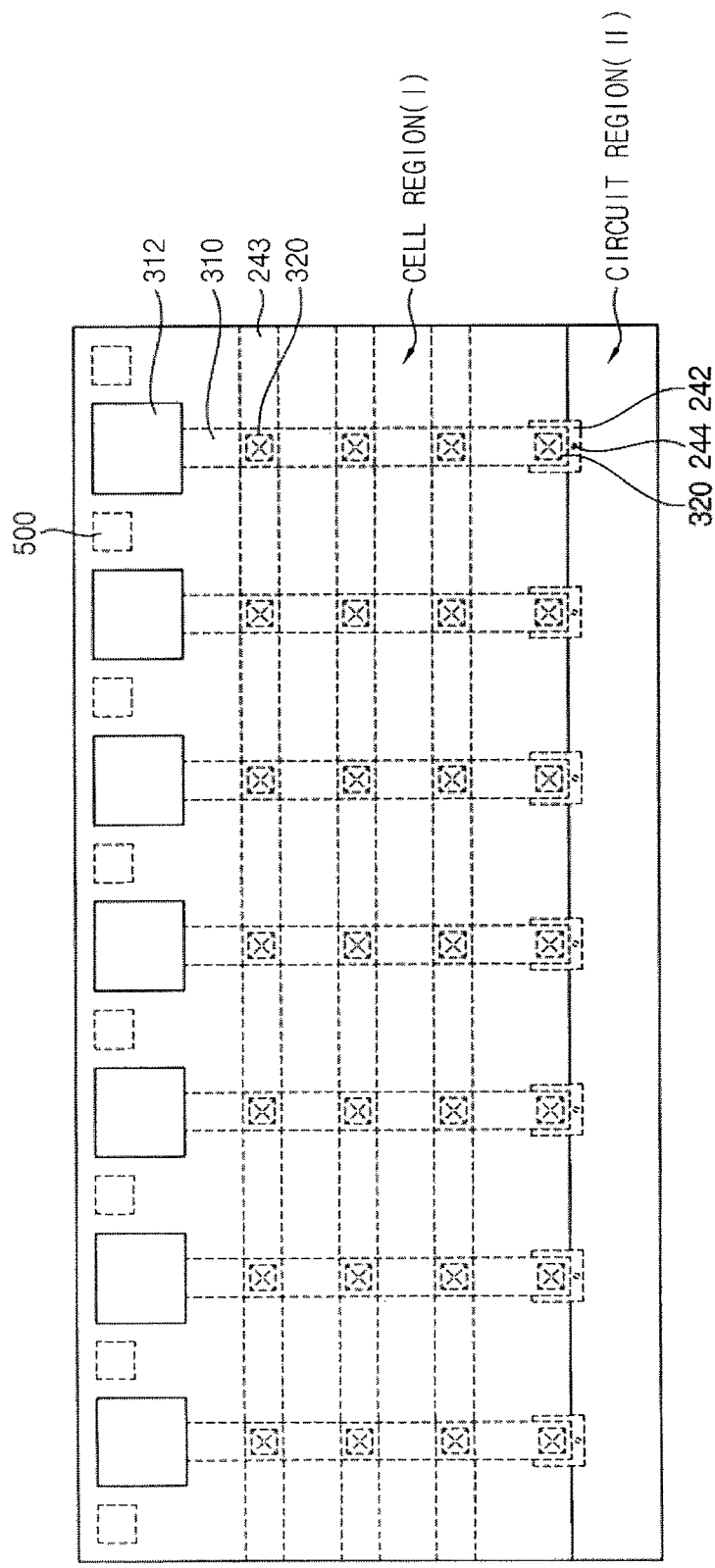
FIG. 9 illustrates another embodiment of a semiconductor device.

FIG. 9 illustrates an embodiment of a semiconductor device, which may be substantially the same as or similar to the semiconductor device of FIGS. 1 to 3, except for additional uppermost connection wirings connecting redistribution wirings and additional electrostatic discharge (ESD) elements.

Referring to FIG. 9, an uppermost wiring of an uppermost wiring layer may include at least one uppermost connection wiring 243 which connects a plurality of redistribution wirings 310 that are spaced apart from each other. A plurality of the uppermost connection wirings 243 may be arranged along the one redistribution wiring 310 and spaced apart from each other. The uppermost connection wiring 243 may cross over the redistribution wiring 310.

A semiconductor device may include electrostatic discharge elements (conductors) 500 respectively electrically connected to the redistribution wirings 310. The electrostatic discharge elements 500 may be arranged in a chip peripheral region and electrically connected to a redistribution landing pad 312 by the uppermost connection wiring 243 and a redistribution via 320. Because the electrostatic discharge elements 500 are in the chip peripheral region, an ESD element in a circuit region I can be omitted and, thus, a chip size may be reduced.

Figure 10:
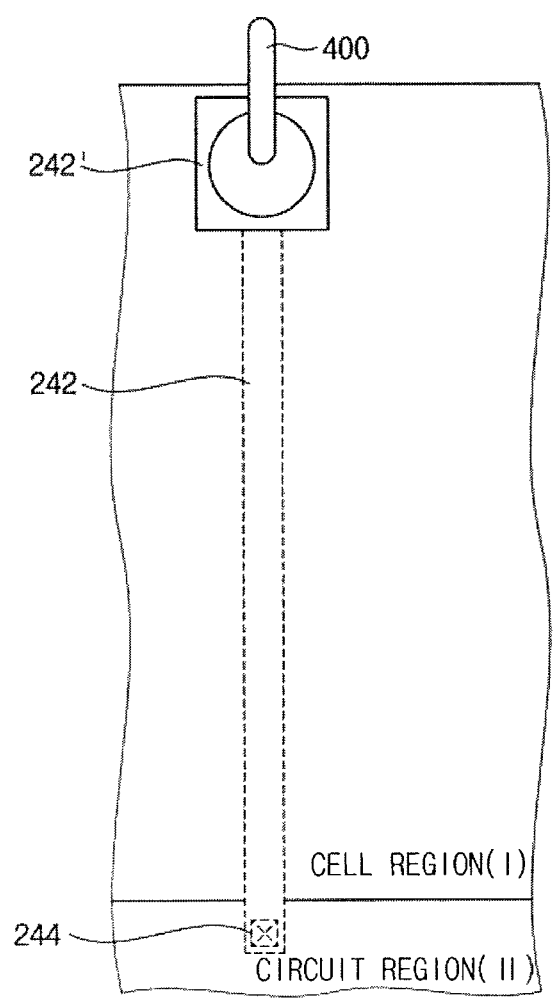
FIG. 10 illustrates another embodiment of a semiconductor device.

FIG. 10 illustrates another embodiment of a semiconductor device, which may be substantially the same or similar to the semiconductor device of FIGS. 1 to 3, except that an uppermost wiring is used as a redistribution wiring.

Referring to FIG. 10, an uppermost wiring 242 may extend from a circuit region II to a cell region I. An uppermost chip pad 242' of the uppermost wiring 242 may be arranged in an edge region in the cell region I of a semiconductor device to serve as a chip pad. Another end portion of the uppermost wiring 242 may be connected to a secondary uppermost wiring by a third via 234, which is different from other pad structures which have been proposed.

Accordingly, the uppermost wiring 242 may extend from the circuit region II to the cell region I and the uppermost chip pad 242' as a portion of the uppermost wiring 242 may be connected to a bonding wire. Thus, a redistribution wiring may be omitted to thereby reduce costs.

Figure 11:
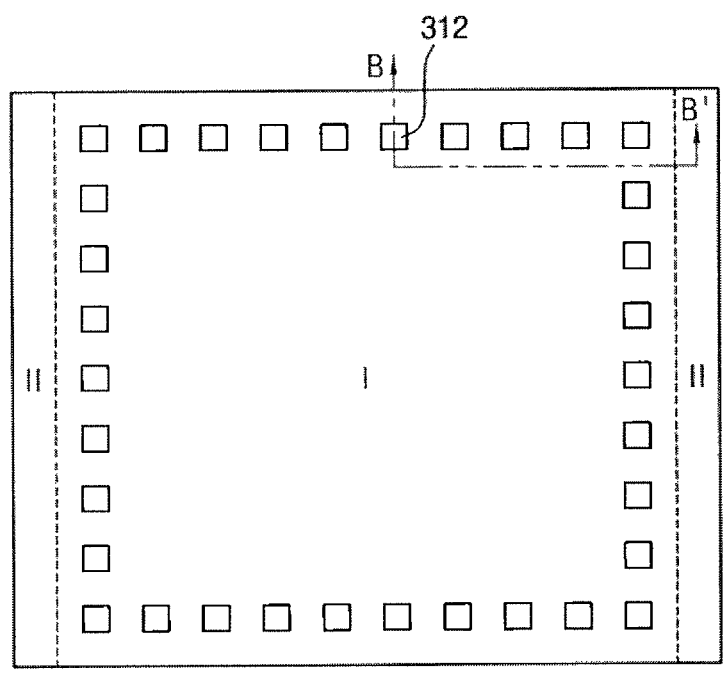
FIG. 11 illustrates another embodiment of a semiconductor device.
Figure 12:
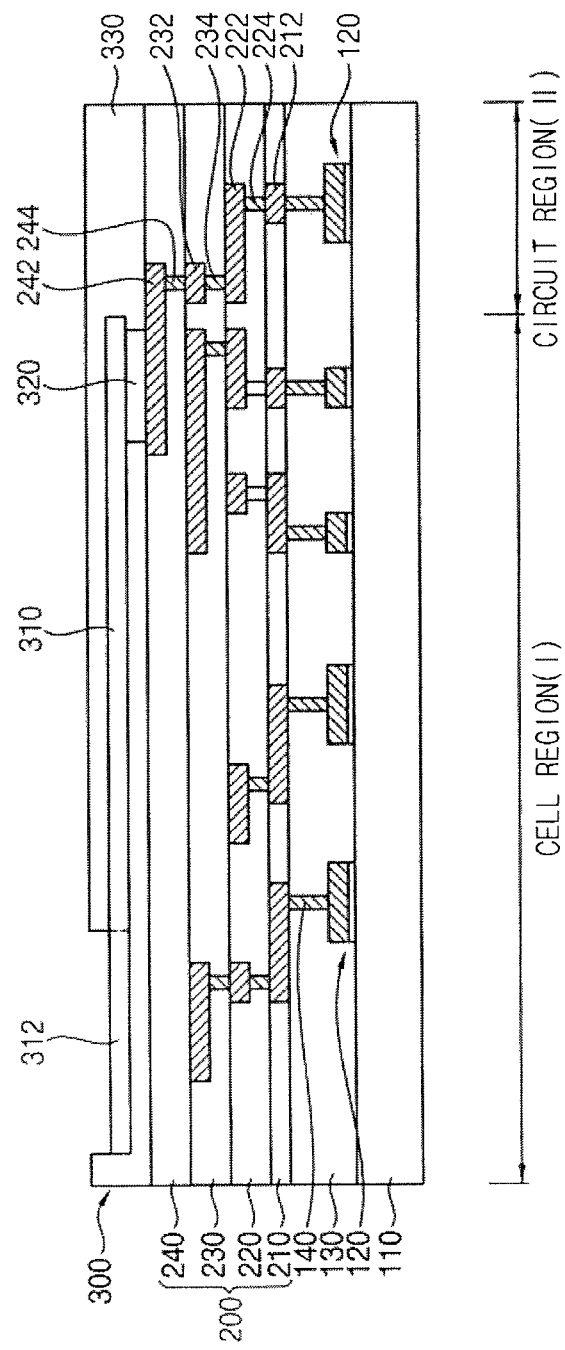
FIG. 12 illustrates another embodiment of a semiconductor device.
Figure 13:
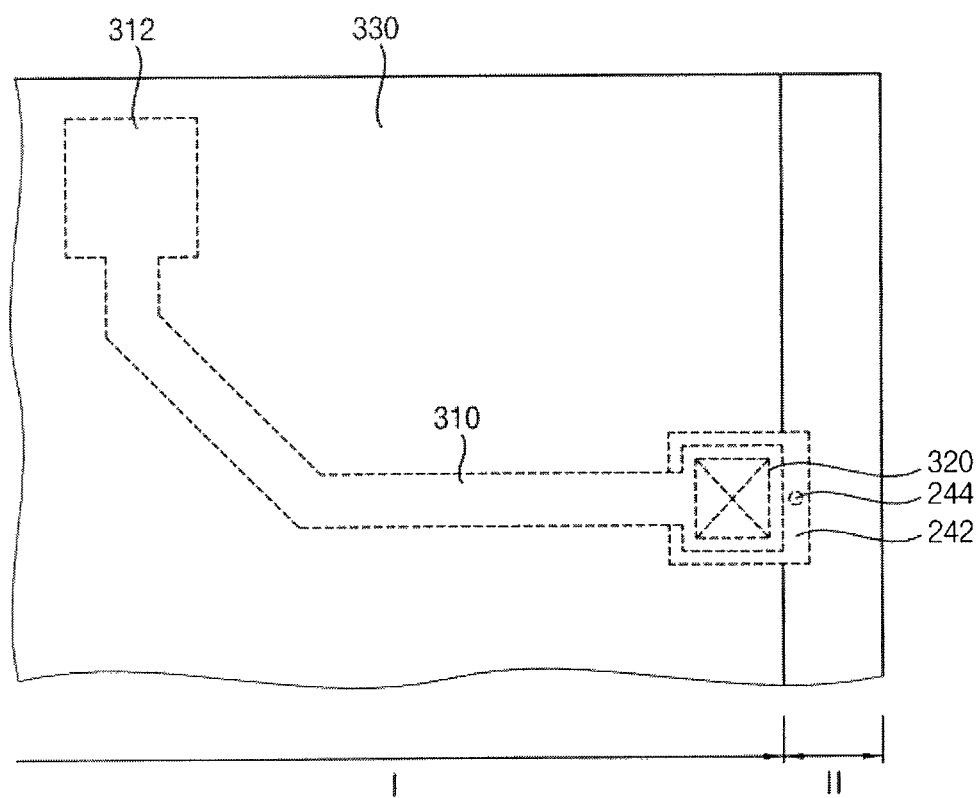
FIG. 13 illustrates another embodiment of a semiconductor device.

FIG. 11 illustrates another embodiment of a semiconductor device 101. FIG. 12 is a cross-sectional view illustrating the semiconductor device in FIG. 11. FIG. 13 is a plan view illustrating the semiconductor device in FIG. 12. FIG. 12 is a cross-sectional view taken along the line B-B' in FIG. 11. The semiconductor device may be substantially the same or similar to the semiconductor device of FIGS. 1 to 3, except for the arrangement of a cell region and a circuit region.

Referring to FIGS. 11 to 13, a semiconductor device 101 may include a substrate 110, and an insulation interlayer 130, an upper wiring layer 200 and a redistribution layer 300 sequentially formed on the substrate 110.

In example embodiments, the substrate 110 may include a first region I and a second region II. The first region I and the second region II may be a cell region and a circuit region, respectively. Memory cells may be in the first region I and peripheral circuits for driving the memory cells may be in the second region II. For example, the circuit region II may be in a peripheral region of the semiconductor device 100. The cell region I may be in a middle region between the cell regions. A plurality of redistribution landing pads 312 may be along an edge of the semiconductor device in the cell region I.

The upper wiring layer 200 may include first to fourth metal wiring layers 210, 220, 230, and 240 sequentially formed on the insulation interlayer 130. The fourth metal wiring layer 240 serves as an uppermost wiring layer and may include a fourth wiring. The third metal wiring layer 230 serves as a secondary uppermost wiring layer and may include a third wiring.

The third wiring may include a secondary uppermost wiring 232 in the circuit region II. The fourth wiring may include an uppermost chip pad 242 extending from the circuit region II to the cell region I. A portion of the uppermost chip pad 242 may overlap the secondary uppermost wiring 232 in the circuit region II. The uppermost chip pad 242 may be in the uppermost metal wiring layer of the semiconductor device 100, and may be a chip pad for establishing electrical connection with an external device.

The redistribution wiring layer 300 may include a redistribution wiring 310 on the upper wiring layer 200, and a protection layer 330 on the upper wiring layer 200 to cover the redistribution wiring 310 and to expose at least a portion of a first end portion of the redistribution wiring 310, that is, a redistribution landing pad 312. The redistribution wiring layer 300 may include a redistribution via 320 in the cell region I and on the uppermost wiring, that is, the uppermost chip pad 242. A second end portion of the redistribution wiring 310 may be opposite to the first end portion and on the redistribution via 320.

The first end portion of the redistribution wiring 310 may include the redistribution landing pad 312. The second end portion of the redistribution wiring 310 may contact the underlying redistribution via 320. Accordingly, the second end portion of the redistribution wiring 310 may be electrically connected to the uppermost wiring, that is, the uppermost chip pad 242, by the redistribution via 320.

Figure 14A:
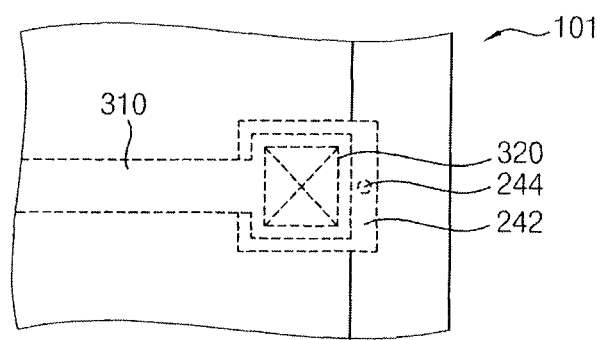
FIGS. 14A and 14B illustrate, respectively, an embodiment of an uppermost chip pad of the semiconductor device in FIG. 13 and the uppermost chip pad of a comparative example of a semiconductor device.
Figure 14B:
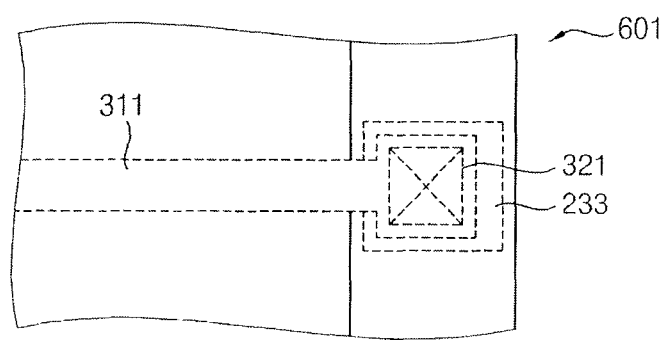

FIG. 14A illustrates an embodiment of the uppermost chip pad of the semiconductor device in FIG. 13, and FIG. 14B illustrates a comparative example of an uppermost chip pad of a semiconductor device.

Referring to FIG. 14A, the uppermost chip pad 242 in FIG. 13 may extend from the circuit region II to the cell region I and the redistribution wiring 310 may be in the cell region I. On the other hand, in FIG. 14B, an uppermost chip pad 233 of a semiconductor device 601 may be in the circuit region II and the redistribution wiring 311 may extend from the circuit region II to a cell region I.

The uppermost chip pad 233 in FIG. 14B may be in the circuit region II, may have a sufficient size capable of supporting the redistribution wiring 311, and thus may occupy a relatively large space in the circuit region II.

The uppermost chip pad 242 in FIG. 14A may extend from the circuit region II to the cell region I. The redistribution via 320 on the uppermost chip pad 242 may be at a predetermined position in the cell region I, not the circuit region II. For example, the position of the uppermost chip pad occupying the circuit region II may be shifted to the cell region I by a predetermined distance S1. Thus, the area of the circuit region II may be reduced at least by the shifted area of the uppermost chip pad, thereby reducing the total chip size.

Figure 15:
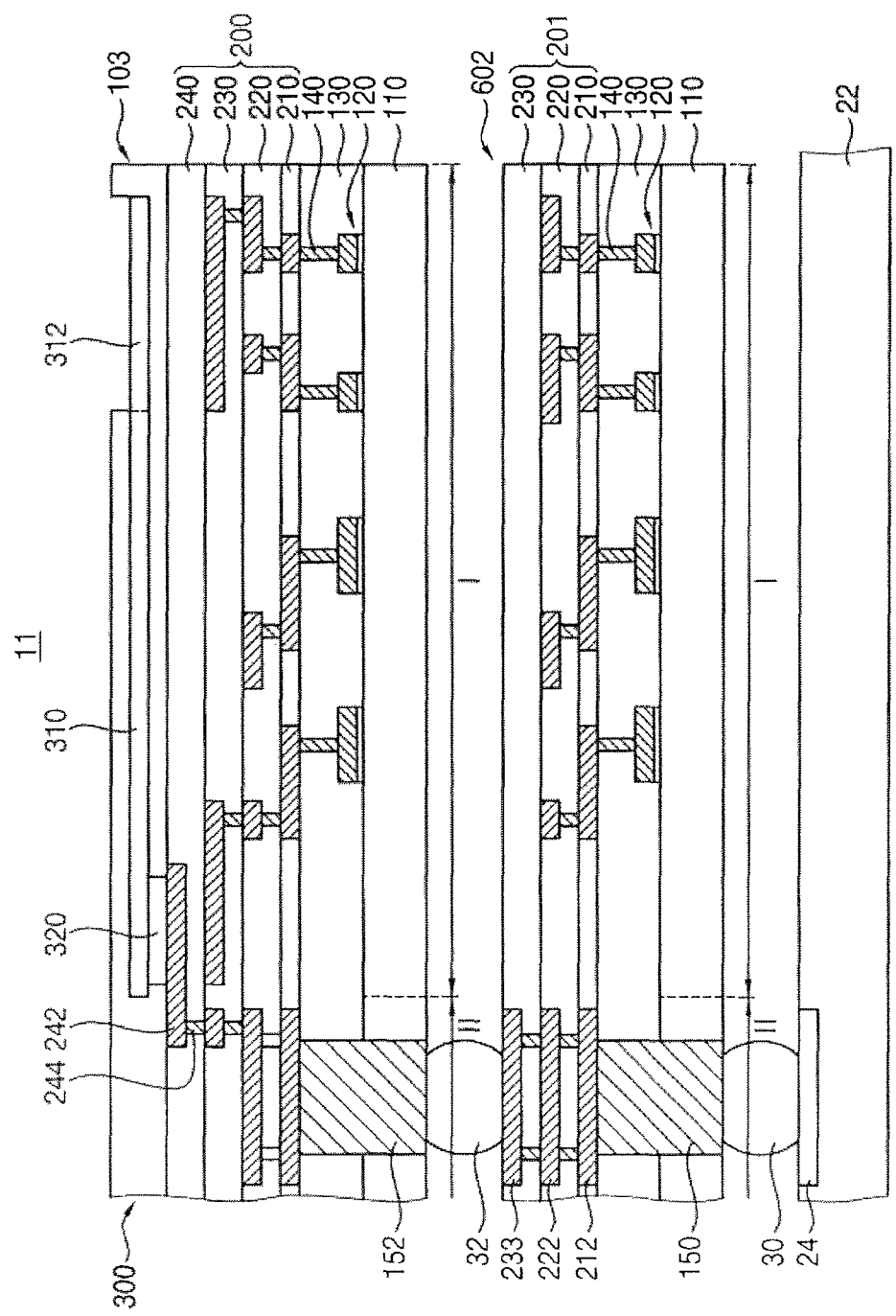
FIG. 15 illustrates a comparative example of a semiconductor package.

FIG. 15 illustrates a comparative example of a semiconductor package 11, which may be substantially the same as or similar to the semiconductor package in FIG. 1, except for a plurality of semiconductor devices stacked on one another.

Referring to FIG. 15, a semiconductor package 11 may include a package substrate 21, and a first semiconductor device 602 and a second semiconductor device 103 sequentially stacked on the package substrate 21. In example embodiments, the first semiconductor device 602 may include a substrate 110 and a first plug 150 penetrating through the substrate 110.

The second semiconductor device 103 may include a substrate 110 and a second plug 152 penetrating through the substrate 110. A first conductive connection member 30 may be on a connection pad 24 of the package substrate 21 to electrically connect the first plug 150 to the connection pad 24.

A second conductive connection member 32 may be on an end portion of the first plug to electrically connect the first plug 150 to the second plug 152. A penetrating electrode, as a through silicon via (TSV), may be used for the first and second plugs. The first and second conductive connection members may include a conductive bump, a solder ball, etc. Accordingly, the first and second semiconductor devices 602 and the 103 may be electrically connected to each other by the first and second plugs 150 and 152.

The first semiconductor device 602 may include a substrate 110, and an insulation interlayer 130, an upper wiring layer 201 and a redistribution layer 301 sequentially formed on the substrate 110. The upper wiring layer 201 may include first to third metal wiring layers 210, 220, and 230 sequentially formed on the insulation interlayer 130.

The third metal wiring layer 230 as an uppermost wiring layer may include a third wiring. The second metal wiring layer 220 as a secondary uppermost wiring layer may include a second wiring. The second wiring may include a secondary uppermost wiring 222 in the circuit region II. The third wiring may include an uppermost chip pad 233 in the circuit region II.

The second semiconductor device 103 may include a substrate 110, and an insulation interlayer 130, an upper wiring layer 200 and a redistribution layer 300 sequentially formed on the substrate 110. The upper wiring layer 200 may include first to fourth metal wiring layers 210, 220, 230, and 240 sequentially formed on the insulation interlayer 130.

The fourth metal wiring layer 240 as an uppermost wiring layer may include a fourth wiring. The third metal wiring layer 230 as a secondary uppermost wiring layer may include a third wiring. The third wiring may include a secondary uppermost wiring in the circuit region II. The fourth wiring may include an uppermost chip pad 242 extending from the circuit region II to the cell region I.

The redistribution wiring layer 300 may include a redistribution wiring 310 on the upper wiring layer 200 and a protection layer 330 on the upper wiring layer 200 to cover the redistribution wiring 310 and expose at least a portion of a first end portion of the redistribution wiring 310, that is, a redistribution landing pad 312. The redistribution wiring layer 300 may include a redistribution via 320 in the cell region I and on the uppermost wiring, that is, the uppermost chip pad 242. A second end portion of the redistribution wiring 310 may be opposite to the first end portion and may be on the redistribution via 320.

The semiconductor package including semiconductor device according to any of the aforementioned embodiments may be applied to various types of semiconductor devices and systems. For example, the semiconductor package may be applied to logic devices such as central processing units (CPUs), main processing units (MPUs), or application processors (APs), or the like. Additionally, the semiconductor package may be applied to volatile memory devices such as DRAM devices, SRAM devices, or non-volatile memory devices such as flash memory devices, PRAM devices, MRAM devices, ReRAM devices, or the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, various changes in form and details may be made without departing from the spirit and scope of the embodiments set forth in the claims.

What is claimed is:

1. A semiconductor device, comprising:
a substrate including a cell region and a circuit region;
an upper wiring layer on the substrate and including a secondary uppermost wiring in the circuit region and an uppermost wiring on the secondary uppermost wiring, the uppermost wiring including an uppermost chip pad electrically connected to the secondary uppermost wiring, at least a portion of the uppermost chip pad being in the cell region; and
a redistribution wiring layer on the upper wiring layer and including at least one redistribution wiring electrically connected to the uppermost chip pad, at least a portion of the at least one redistribution wiring serving as a landing pad connected to an external connector.

2. The semiconductor device as claimed in claim 1, further comprising:
an insulation interlayer covering a circuit pattern on the substrate,
wherein the upper wiring layer is on the insulation interlayer.

3. The semiconductor device as claimed in claim 1, wherein:
the upper wiring layer includes first to fourth wirings sequentially stacked on one another,
the third wiring includes the secondary uppermost wiring, and
the fourth wiring includes the uppermost wiring.

4. The semiconductor device as claimed in claim 1, wherein the at least one redistribution wiring extends in the cell region.

5. The semiconductor device as claimed in claim 1, wherein the uppermost chip pad is electrically connected to the secondary uppermost wiring by a via in the circuit region.

6. The semiconductor device as claimed in claim 1, wherein the uppermost chip pad is electrically connected to the at least one redistribution wiring by a redistribution via in the cell region.

7. The semiconductor device as claimed in claim 1, wherein:
the redistribution wiring layer includes a plurality of the redistribution wirings spaced apart from each other, and
the uppermost wiring includes an uppermost connection wiring connecting the plurality of redistribution wirings to each other.

8. The semiconductor device as claimed in claim 7, wherein the uppermost connection wiring is electrically connected to an electrostatic discharge conductor.

9. The semiconductor device as claimed in claim 7, wherein:
the uppermost wiring includes first and second uppermost wirings respectively connected to the plurality of redistribution wirings spaced apart from each other, and the first and second uppermost wirings have different lengths or widths.

10. The semiconductor device as claimed in claim 1, wherein at least a portion of the uppermost wiring includes an inductor in the cell region.

11. A semiconductor device, comprising:
a substrate including a cell region, a circuit region, and circuit patterns;
an insulation interlayer on the substrate to cover the circuit patterns;
an upper wiring layer on the insulation interlayer and including first, second, third, and fourth wirings sequentially stacked on one another, the third wiring including a secondary uppermost wiring in the circuit region, the fourth wiring including an uppermost chip pad electrically connected to the secondary uppermost wiring, at least a portion of the uppermost chip pad being in the cell region; and
a redistribution wiring layer on the upper wiring layer and including at least one redistribution wiring electrically connected to the uppermost chip pad, at least a portion of the at least one redistribution wiring serving as a landing pad connected to an external connector.

12. The semiconductor device as claimed in claim 11, wherein the at least one redistribution wiring extends in the cell region.

13. The semiconductor device as claimed in claim 11, wherein the uppermost chip pad is electrically connected to the at least one redistribution wiring by a redistribution via in the cell region.

14. The semiconductor device as claimed in claim 11, wherein:
the redistribution wiring layer includes a plurality of the redistribution wirings spaced apart from each other, and
the upper wiring layer includes an uppermost connection wiring connecting the redistribution wirings to each other.

15. The semiconductor device as claimed in claim 11, wherein at least a portion of the fourth wiring includes an inductor in the cell region.

16. A semiconductor device, comprising:
a cell region;
a circuit region;
a chip pad at least partially in the cell region;
a first wiring layer in the circuit region and electrically connected to the chip pad; and
a second wiring layer on the first wiring layer and including at least one redistribution wiring electrically connected to the chip pad,
wherein at least a portion of the at least one redistribution wiring serves as a landing pad connected to an external connector.

17. The semiconductor device as claimed in claim 16, wherein:
the second wiring layer includes a plurality of redistribution wirings that are spaced apart;
the first wiring layer includes a connection wiring connecting the spaced apart redistribution wirings; and
the connection wiring is electrically connected to an electrostatic discharge conductor.

18. The semiconductor device as claimed in claim 16, wherein the at least one redistribution wiring extends in the cell region.

19. The semiconductor device as claimed in claim 16, wherein the chip pad is electrically connected to the at least one redistribution wiring by a redistribution via in the cell region.

* * * * *